United States Patent [19]
Alter et al.

[11] Patent Number: 4,951,101
[45] Date of Patent: Aug. 21, 1990

[54] DIAMOND SHORTING CONTACT FOR SEMICONDUCTORS

[75] Inventors: Martin J. Alter, Los Altos; Clyde M. Brown, Jr., Cupertino; James B. Compton, Los Gatos, all of Calif.

[73] Assignee: Micrel Incorporated, Sunnyvale, Calif.

[21] Appl. No.: 236,454

[22] Filed: Aug. 25, 1988

[51] Int. Cl.$^5$ ............... H01L 29/78; H01L 23/48
[52] U.S. Cl. .................... 357/234; 357/20; 357/23.8; 357/52; 357/68; 357/86; 357/88
[58] Field of Search ............ 357/13, 23.4, 86, 20, 357/23.1, 23.8, 40.45; 52/65, 68, 88

[56] References Cited
U.S. PATENT DOCUMENTS

| | | | |
|---|---|---|---|
| 4,589,002 | 5/1986 | Olmstad | 357/13 |
| 4,641,168 | 2/1987 | Yilmaz | 357/86 |
| 4,825,266 | 7/1987 | Whight | 357/13 |
| 4,833,513 | 5/1989 | Sasaki | 357/65 |

OTHER PUBLICATIONS

"Silconix Underacts Power MOSFET Industry", *Electronic Engineering* (Feb. 1983), p. 15.

Primary Examiner—J. Carroll
Attorney, Agent, or Firm—Skjerven, Morrill, MacPherson, Franklin & Friel

[57] ABSTRACT

A diamond-shaped short contact overlapping two differing conductivity regions in a semiconductor. The shape and orientation providing maximum alignment tolerances for a given size of contact opening.

6 Claims, 4 Drawing Sheets

DIAMOND SHORTING CONTACT FOR SEMICONDUCTORS

BACKGROUND OF THE INVENTION

This invention relates to semiconductor devices, and more particularly to metallic shorting contacts for MOS integrated circuits (IC's).

Shorting contacts are useful in IC circuits to equalize voltage potentials in two regions of opposite conductivity on the chip. In guard band regions on the chip, shorting contacts prevent latchup, provide common ground potential to two regions of opposite conductivity, and aid device performance.

There are basically two widely accepted approaches now known in designing a shorting contact. One approach is a nonself-aligned approach and the other is a self-aligned approach. The nonself-aligned method tends to result in large area contacts which take up a lot of space on a chip, but they are usually simpler and therefore potentially less expensive. The self-aligned approach, although consuming less space on the chip, tends to be more complicated and expensive requiring self-aligning masks such as silicon nitride and are typically used only when very high power or very fast voltage switching speeds are required.

Manufacturing tolerances such as line width, minimum size of openings, and alignment tolerances are part of the design rules for a given I.C. process. It is desired to make the device features as small as possible to conserve space. To do so, the minimum design rules must be maintained. What is needed is a shorting contact which conserves space on the surface of the integrated circuit while maintaining a large alignment tolerance between masking layers.

SUMMARY OF THE INVENTION

The present invention is a method and design for forming a metallic shorting contact for equalizing the voltage potential of two different conductivity regions of an integrated circuit. The method consists of rotation the contact opening approximately 45° relative to the regions to be shorted.

The alignment tolerances between the edges of the conductivity regions and the overlapping shorting contact are greatly increased. Use of the invention allows a small contact to be made while maintaining the same design rules for alignment tolerances.

BRIEF DESCRIPTION OF THE DRAWINGS

These and other advantages of the present invention may be appreciated from studying the following description of the presently preferred exemplary embodiments together with the drawings in which.

DETAILED DESCRIPTION

Figure 1:
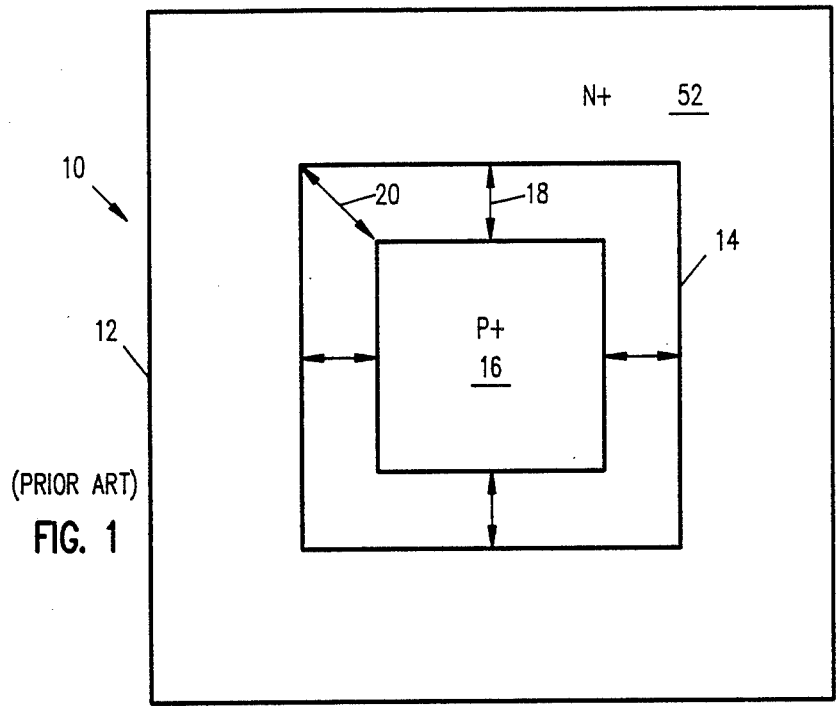
FIG. 1 is a top plan review of the prior art.

Shown in FIG. 1 is a cell structure 10 of a MOS integrated circuit. The outer perimeter of the device cell can be made up of polysilicon gate material 12 which has a shorting contact 14. Contact 14 overlays a P+ region 16 and is used to short the P+ region 16 to the N+ region 52. The P+ region 16 was originally formed by use of an oxide or photoresist mask of a size typically in the order of 6 microns×6 microns. The P+ dopant was deposited through a field oxide from a dopant source or by use of ion implantation techniques standard to the fabrication of integrated circuits. At a later masking step, the shorting contact 14 was aligned to the poly region 12 and is of the size 10 microns×10 microns. This produces an alignment tolerance labeled 18 on the order of two microns from the edge of the P+ region 16 to the edge of the contact opening 14. The alignment tolerance from the corner of the P+ region to the corner of the shorting contact is labeled 20 and is on the order 2.8 microns.

Figure 2:
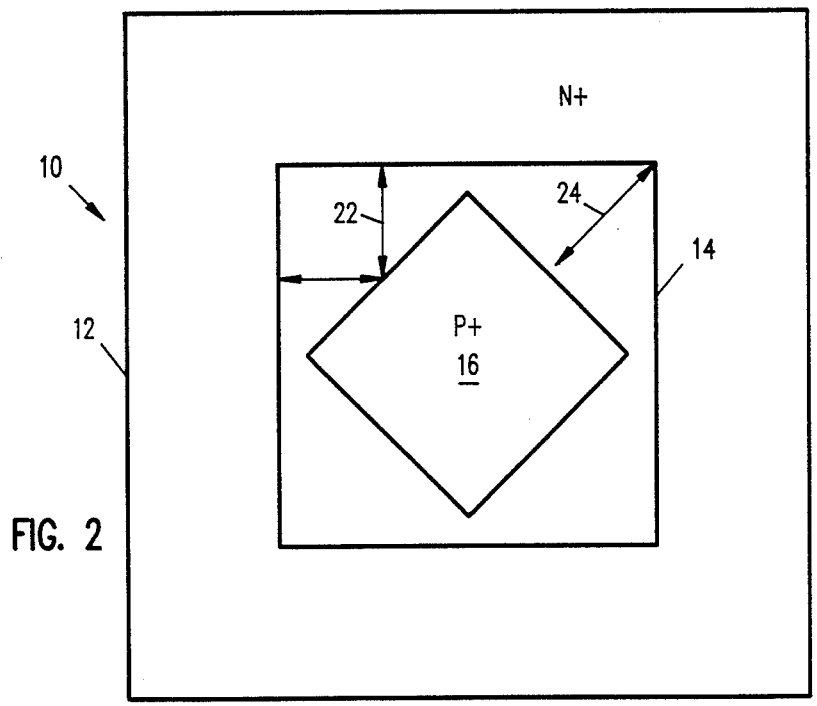
FIG. 2 is a top plan review of the present invention.

During mask alignment of the contact to the poly region 12, resulting alignment to the P+/N+ regions, are very important. The invention shown in FIG. 2 improves the contact "efficiency" by having the P+/N+ regions rotated 45° relative to the contact opening. The contact shown has an edge to edge alignment tolerance 22 of 2.8 microns and a corner to corner alignment tolerance 24 of approximately 4 microns for the same feature size.

Figure 3:
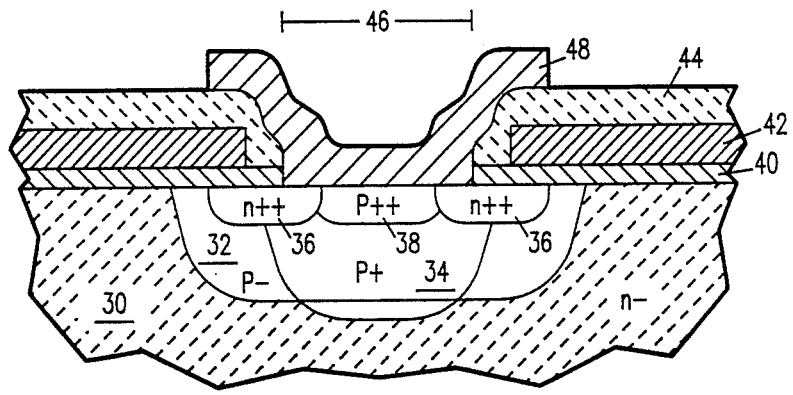
FIG. 3 is a cross sectional review of the present invention.

A cross sectional view is shown in FIG. 3 wherein a vertical double diffused MOS (VDMOS) cell structure is shown. The body of the silicon substrate 30 is generally N− which can be a grown epitaxial layer or bulk silicon. P− layer 32, P+ layer 34, N++ layer 36 and P++ layer 38 are all formed in the process of making integrated circuits. Gate oxide 40, the polysilicon material for the gate electrode 42 and a reflow glass of the borosilicate or phosphorosilicate glass type 44, make up the remaining layers of an integrated circuit. It is desired to form an area-efficient shorting contact to electrically short the P++ region with the N++ region. According to the preferred embodiment of the present invention contact opening 46 was formed through the various layers of glass and aluminum layer 48 was deposited within the contact opening to form the shorting contact.

Figure 4:
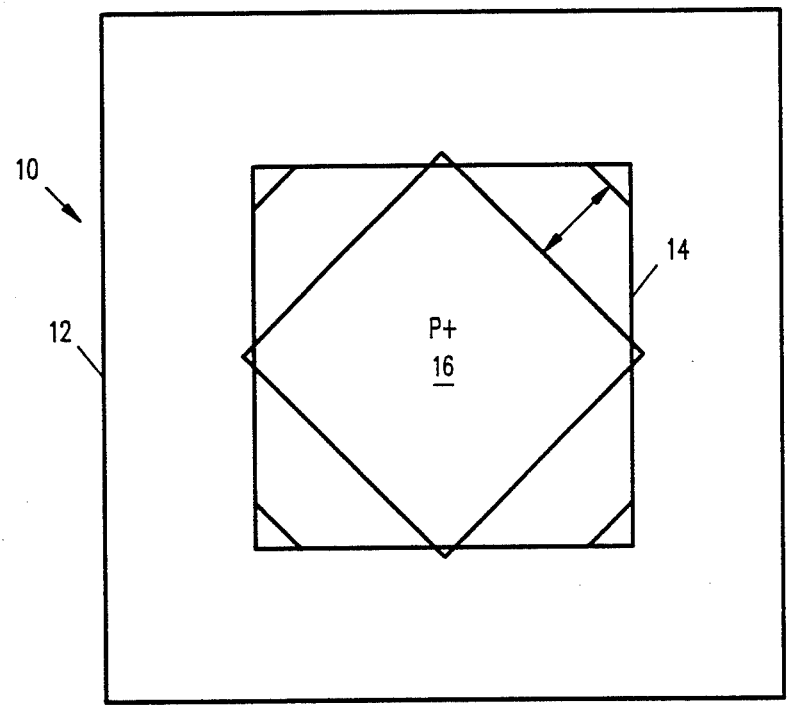
FIG. 4 is a top plan review detailing the relative savings in area of the present invention.

In the example discussed earlier, a 6 micron×6 micron P+ region was being overlapped by a 10 micron×10 micron shorting contact. The resulting alignment tolerance was 2 microns edge to edge and 2.8 microns from corner to corner. Employing the present invention allows the same feature size of contact opening in the poly gate regions to provide larger contact regions to the N+ region. Alternatively, a smaller contact can be made to the P+ region while maintaining the same 2 micron design rule alignment tolerances. Shown in FIG. 4 is cell 10 having poly gate region 12 and contact opening 14 surrounding P+ region 16. In this case, the 6 microns×6 microns P+ region can be aligned to by an overlapping 8×8 micron shorting contact while maintaining the two micron alignment tolerance. Use of the invention allows a significant reduction in source region cell size in this VDMOS-source example. In the examples, the prior art contact is 25% larger than in the shorting contact of the present invention for the same alignment tolerance. The fundamental principal demonstrated here is that by modifying the shape of N+/P+ region relative to the contact, considerable advantage can be obtained in shorting contact size or contact "efficiency".

Figure 5A:
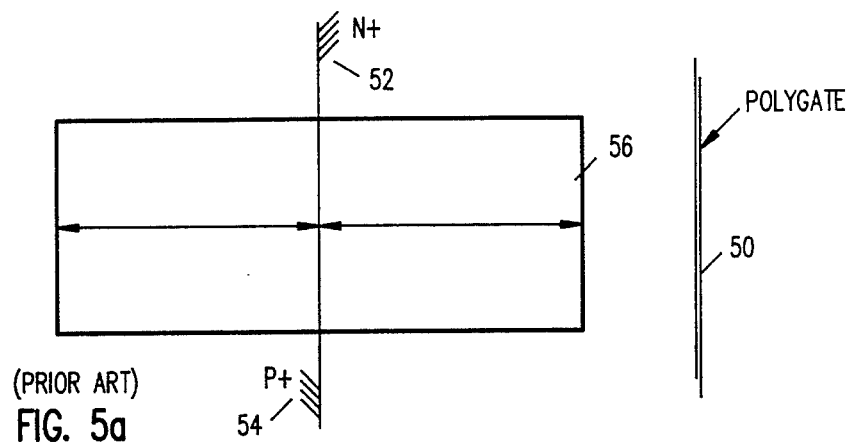
FIG. 5a is an alternative prior art design.
Figure 5B:
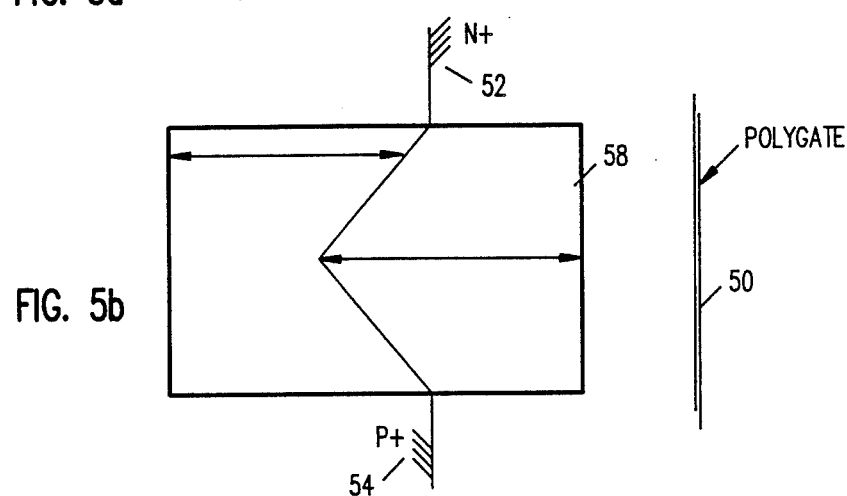
FIG. 5b shows an alternative embodiment of the present invention for use in termination contacts.

The advantages of the present diamond shorting contact invention can be employed in lateral diffused MOS (LDMOS), complementary MOS (CMOS), vertical diffused MOS (VDMOS) or bipolar devices such as transistors and rods or resistors and termination rings which are not cellular like the VDMOS source shorting as shown in the previous examples. An approach to produce the same advantage as discussed in the previous paragraphs with other silicon device structures is shown in FIGS. 5a and 5b. FIG. 5a is a prior art contact of a termination ring within a VDMOS structure. Polysilicon gate 50 adjacent to N+ region 52 boarders P+ region 54 to which a shorting contact is desired to be made. The size of contact 56 is on the order of 6 microns × 12 microns. This opening will be filled in with metal and thereby short the N+ region 52 together with the P+ region 54 forming an equal potential junction.

The embodiments of the present invention are shown in FIG. 5b where the polysilicon gate region 50 has an adjacent N+ region 52 and an adjacent P+ region 54 and a contact opening 58. Contact opening 58 has nominal dimensions of 6 microns × 8 microns and overlies a diamond shaped perimeter between the N+ and P+ region thereby enabling a much smaller contact opening to be made to achieve the electrical shorting of the prior art design. Less area is needed on the silicon integrated circuit which thereby reducing its cost and increasing the I.C.'s packing density.

Figure 6A:
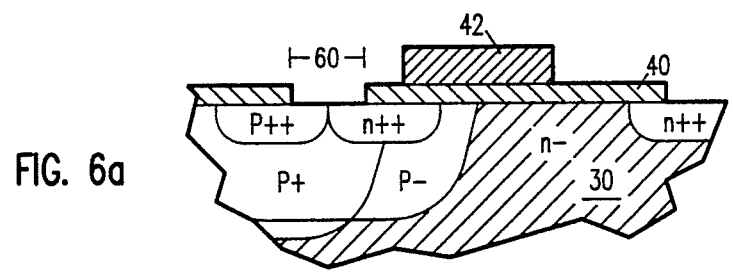
FIG. 6 shows the cross sectional structure of a shorting contact for use with lateral diffused MOS and complementary MOS device structures.
Figure 6B:
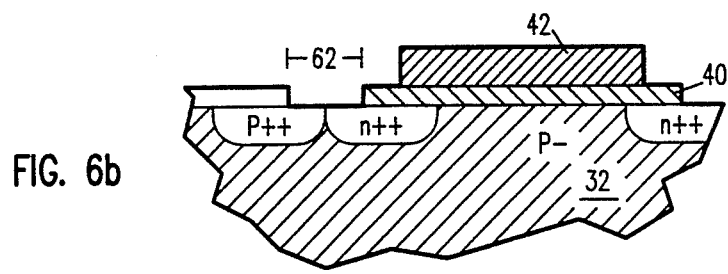

The present invention can be employed in lateral double diffused MOS structures as well as complementary MOS structures as shown in FIGS. 6a and 6b respectively. In FIG. 6a silicon substrate 30 is lightly N doped and contains the structure for LDMOS transistor having P+, P−, N++ and P++ regions. A contact opening 60 is formed over the abutting N++ and P++ regions in a novel diamond shape saving area on the integrated circuit while maintaining or improving on the alignment tolerances. In 6b a P− bulk silicon layer 32 has formed on it an N− channel CMOS transistor. Contact opening 62 employing the diamond shape of the present invention is formed over the P+ to N+ abutting perimeter to form a guard ring between transistors to prevent latch-up.

Figure 7:
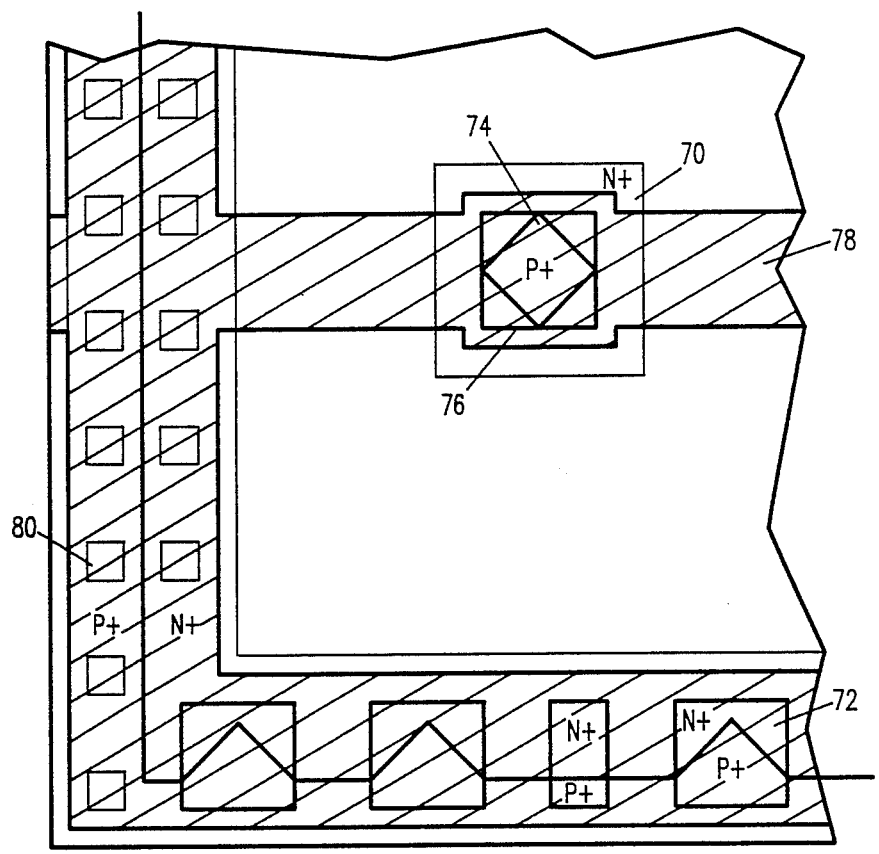
FIG. 7 is a top plan review of an integrated surface design showing the use of the present invention and its alternative embodiments.

FIG. 7 is a top plan view which shows the use of the diamond shaped shorting contact on a VDMOS high voltage transistor cell 70 while having the one-half diamond shaped termination rings 72 and having some smaller shorting contacts according to the prior art 80. The inside portion of the N+ cell 70 contains a P+ region 74 surrounded by the contact 76 which opens to a N+ region within the contact opening 76 to the P+ region 74 and is used to carry current or voltage signals to the remainder of the integrated circuit. While certain embodiments of this invention have been described, other related structures and processes will be obvious in view of this disclosure. Therefore, persons of ordinary skill in this field are to understand that all equivalent structures, modifications and changes are to be included within the scopes of the following claims.

What is claimed is:

1. In a semiconductor element having substantially square first conductivity type region formed within a second conductivity type region, a shorting contact opening comprising:
   a substantially square contact opening overlapping at least a portion of each of said first and second conductivity type regions, but not completely overlapping said second conductivity type region, wherein sides of said first conductivity type region are at substantially 45° angles with respect to sides of said contact opening.

2. A shorting contact formed on a semiconductor substrate for shorting a substantially square first conductivity type region to a second conductivity type region, said first conductivity type region being formed within said second conductivity type region, said shorting contact comprising:
   a conductive material filling a contact opening to electrically short said first conductivity type region to said second conductivity type region, said contact opening being substantially square and overlapping at least a portion of said first conductivity type region and a portion of said second conductivity type region, but not completely overlapping said second conductivity type region, said first conductivity type region having sides which are at substantially 45° angles to sides of said contact opening.

3. The shorting contact of claim 2 wherein said contact opening is in the range of a 4 to 8 microns square.

4. The shorting contact of claim 2, wherein said second conductivity type region is formed to have a rectilinear shape, and wherein said substantially square contact opening has sides which are substantially parallel and perpendicular to sides of said second conductivity type region, and wherein said substantially square first conductivity type region has sides which are at substantially 45° angles with said sides of said second conductivity type region.

5. A semiconductor element and shorting contact structure comprising:
   first and second conductivity type regions abutting each other along a border, said first conductivity type region having one or more V-shaped portions, each of said V-shaped portions forming a section of said border, remaining portions of said border not being formed of said one or more V-shaped portions being substantially linear;
   a separate contact opening positioned over each of said one or more V-shaped portions, said contact opening positioned so as to overlap a portion of said first conductivity type region and a portion of said second conductivity type region, but not so as to completely overlap either of said first or second conductivity type regions, and
   a conductive material filling said contact opening to electrically short said first conductivity type region to said second conductivity type region.

6. The semiconductor element and shorting contact structure of claim 5, wherein said contact opening is rectilinear.

* * * * *